(12) United States Patent
Butt et al.

(10) Patent No.: US 7,443,741 B2
(45) Date of Patent: Oct. 28, 2008

(54) DQS STROBE CENTERING (DATA EYE TRAINING) METHOD

(75) Inventors: Derrick Sai-Tang Butt, San Leandro, CA (US); Hui-Yin Seto, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 502 days.

(21) Appl. No.: 11/176,041

(22) Filed: Jul. 7, 2005

(65) Prior Publication Data

US 2007/0008791 A1    Jan. 11, 2007

(51) Int. Cl.
*G11C 7/00* (2006.01)
(52) U.S. Cl. .................. 365/193; 365/201; 365/174
(58) Field of Classification Search .............. 365/193, 365/201, 194, 191, 233, 189.07, 189.08, 365/189.06, 185.22, 77

See application file for complete search history.

(56) References Cited

U.S. PATENT DOCUMENTS

| 6,996,749 | B1 * | 2/2006 | Bains et al. ............... 714/42 |
| 7,171,321 | B2 * | 1/2007 | Best ....................... 702/106 |
| 7,209,396 | B2 * | 4/2007 | Schnell .................... 365/193 |
| 7,277,333 | B2 * | 10/2007 | Schaefer .................. 365/194 |
| 2005/0105349 | A1 * | 5/2005 | Dahlberg et al. .......... 365/201 |

* cited by examiner

*Primary Examiner*—Dang T Nguyen
(74) *Attorney, Agent, or Firm*—Christopher P. Maiorana, PC

(57) ABSTRACT

A method for calibrating a data valid window including the steps of: (A) setting a base delay of one or more datapaths to a predetermined value, (B) determining an optimum offset delay value for each of the one or more datapaths based upon actual memory accesses and (C) delaying a read data strobe signal based upon the base delay and the optimum offset delay value for each of the one or more datapaths.

20 Claims, 8 Drawing Sheets

DQS STROBE CENTERING (DATA EYE TRAINING) METHOD

CROSS REFERENCE TO RELATED APPLICATIONS

The present application may relate to U.S. application Ser. No. 11/097,903, filed Apr. 1, 2005, U.S. application Ser. No. 11/154,401, filed Jun. 16, 2005, U.S. application Ser. No. 11/166,292, filed Jun. 24, 2005, and U.S. application Ser. No. 11/173,529, filed Jul. 1, 2005, now U.S. Pat. No. 7,215,584, issued May 8, 2007, which are each hereby incorporated by reference in their entirety.

FIELD OF THE INVENTION

The present invention relates to memory systems generally and, more particularly, to a method and/or apparatus DQS strobe centering (or data eye training) that may be suitable for a DDR memory application.

BACKGROUND OF THE INVENTION

A double data rate (DDR) synchronous dynamic random access memory (SDRAM) interface receives aligned data (DQ) and read data strobe (DQS) signals from a DDR SDRAM device. The DDR SDRAM interface is responsible for providing the appropriate DQ-DQS relationship. A conventional approach performs system-level timing analysis using a simulation program for integrated circuit emphasis (SPICE) to determine a timing that yields adequate setup and hold time margin within a data valid window. The conventional approach is not programmable and can vary for different hardware implementations. The conventional approach does not calibrate the actual data valid window in silicon. The conventional approach relies heavily on the pre-silicon, system-level, SPICE timing analysis.

It would be desirable to have a read data strobe centering (or data eye training) method for calibrating the actual data valid window.

SUMMARY OF THE INVENTION

The present invention concerns a method for calibrating a data valid window comprising the steps of: (A) setting a base delay of one or more datapaths to a predetermined value, (B) determining an optimum offset delay value for each of the one or more datapaths based upon actual memory accesses and (C) delaying a read data strobe signal based upon the base delay and the optimum offset delay value for each of the one or more datapaths.

The objects, features and advantages of the present invention include providing a method for read data strobe centering (data eye training) that may (i) provide a systematic process for calibrating the center of a data valid window, (ii) enable an upper level memory controller function to perform run time calibration of the data valid window, (iii) be flexible and adaptable to various different system implementations, and/or (iv) eliminate reliance on a system level, pre-silicon, SPICE timing analysis on the data valid window.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
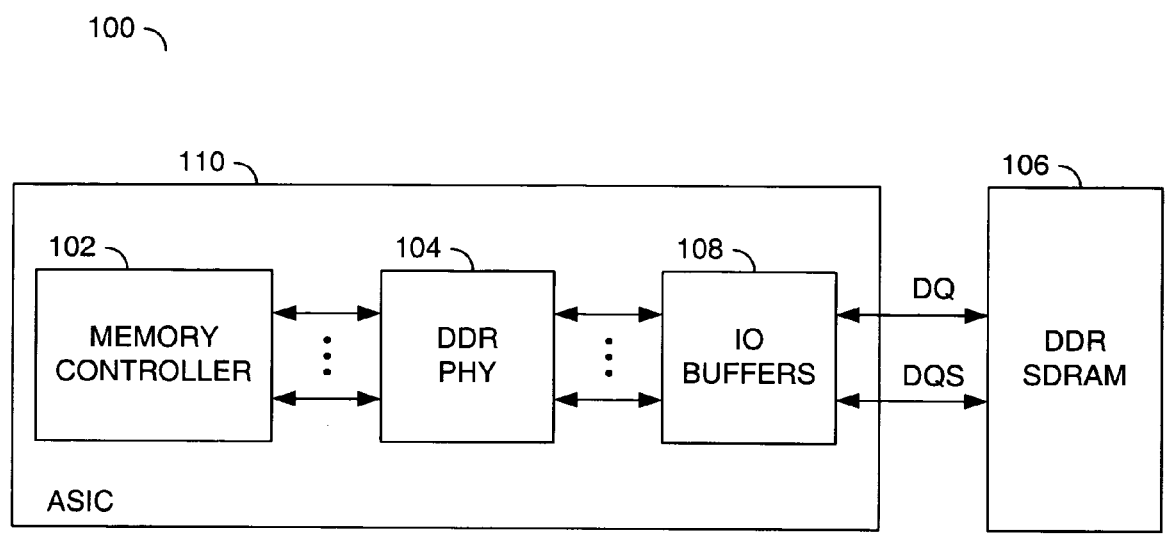
FIG. 1 is a block diagram illustrating a memory system in which an embodiment of the present invention may be implemented.

Referring to FIG. 1, a block diagram is shown illustrating a system 100 in which one or more preferred embodiments of the present invention may be implemented. In one example, the system 100 may comprise a circuit (or block) 102, a circuit (or block) 104, a circuit (or block) 106 and a circuit (or block) 108. The circuit 102 may be implemented as a memory controller. The circuit 104 may be implemented as a memory interface. In one example, the circuit 104 may be implemented as a double data rate (DDR) physical layer (PHY) core. The circuit 106 may be implemented as one or more double data rate (DDR) synchronous dynamic random access memory (SDRAM) devices. The circuit 108 may be implemented, in one example, as stub series terminated logic (SSTL) IO buffers. The circuit 104 may be coupled between the circuit 102 and the circuit 106. In one example, the circuit 104 may be coupled to the circuit 106 by the circuit 108. The circuit 104 may be configured to receive a plurality of data signals (e.g., DQ) and a plurality of read data strobe signals (e.g., DQS). In one example, the plurality of read data strobe signals may comprise a single read data strobe for each byte of the signals DQ. In another example (e.g., an x4 mode), the plurality of data strobe signals DQS may comprise a separate strobe signal (e.g., DQS_UN and DQS_LN, respectively) for each nibble (e.g., upper and lower) of the signal DQ.

In one example, the circuits 102, 104 and 108 may be implemented (or instantiated) on an application specific integrated circuit (ASIC) 110. However, the circuit 102 may be implemented separately and mounted on a common printed circuit board (PCB) along with the circuits 104, 106 and 108. The ASIC 110 may be implemented, in one example, as a platform (or structured) ASIC. In one example, the circuit 104 may be implemented based on diffused datapath (DP) and master delay modules. In another example, the circuit 104 may be implemented based on R-cell datapath and master delay modules. In one example, the circuit 104 may be implemented in an R-cell transistor fabric of the ASIC 110. As used herein, R-cell generally refer to an area of silicon containing one or more diffusions for forming the parts of N and/or P type transistors and the contact points where wires may be attached in subsequent manufacturing steps (e.g., to power, ground, inputs and outputs). Wire layers may be added to the R-cell transistor fabric to make particular transistors, logic gates, soft and firm IP blocks and/or storage elements.

Figure 2:
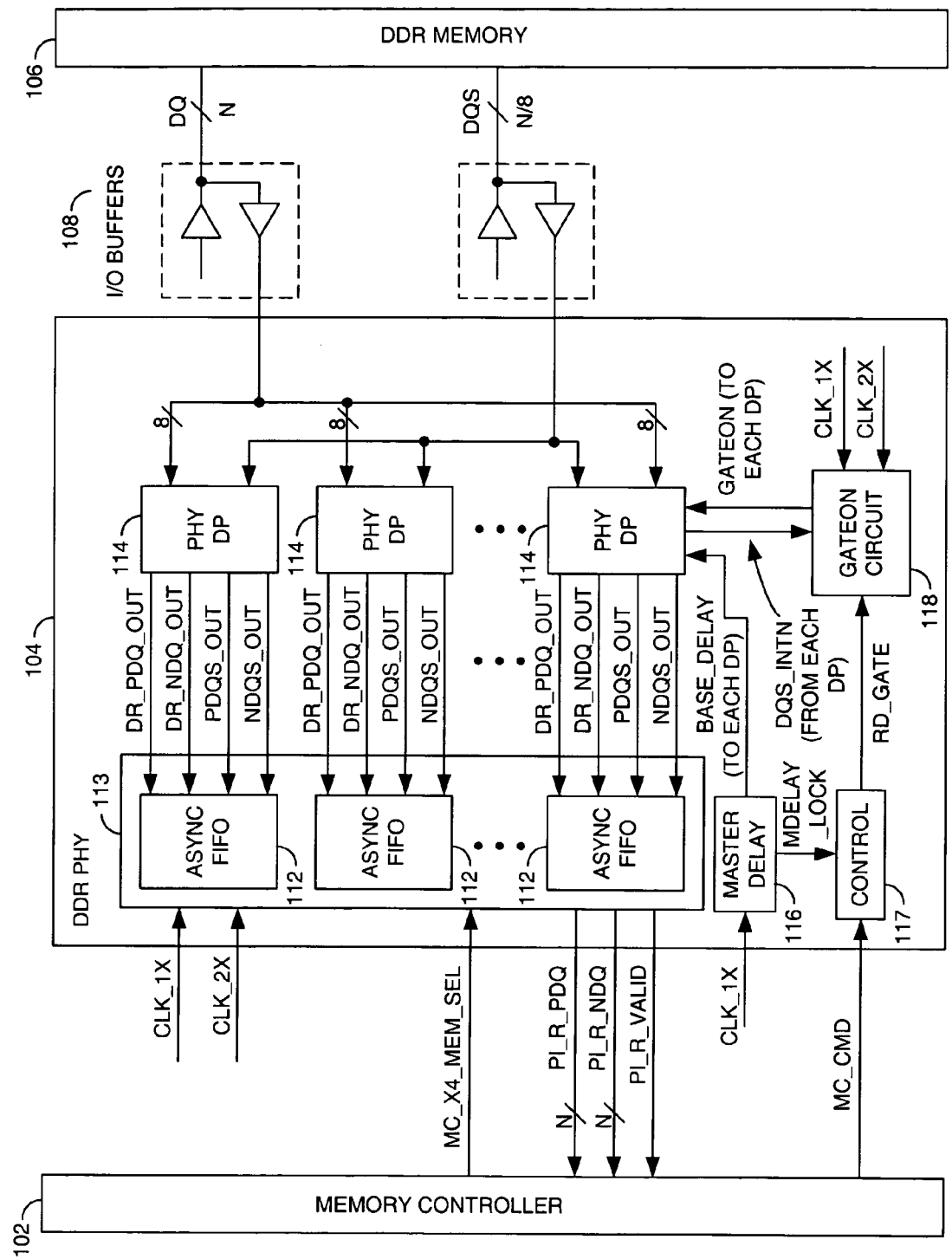
FIG. 2 is a more detailed block diagram of a read data logic and signal paths of a memory interface of FIG. 1.

Referring to FIG. 2, a more detailed block diagram of the circuit 104 is shown illustrating example read data logic and signal paths in which a preferred embodiment of the present invention may be implemented. In one example, the circuit 104 may comprise a number of asynchronous (ASYNC) first-in first-out (FIFO) buffers 112, FIFO synchronization logic 113, a number of physical read datapaths (DPs) 114, a master delay (MDELAY) logic 116, a control logic 117 and a programmable gating signal generator 118. Each of the physical read datapaths 114 may be configured to receive (i) a respective portion of the read data signals DQ from the DDR memory 106, (ii) a respective read data strobe signal or signals DQS associated with the respective portion of the received read data signals and (iii) a gating signal (e.g., GATEON) from the programmable gating signal generator 118. Each of the physical read datapaths 114 may communicate with a corresponding one of the asynchronous FIFOs 112 via a number of signals (e.g., DR_PDQ_OUT, DR_NDQ_OUT, PDQS_OUT, and NDQS_OUT). In one example, separate signals (e.g., PDQS_OUT_UN, NDQS_OUT_UN, PDQS_OUT_LN, and NDQS_OUT_LN) may be generated for each nibble of the DPs 114. In one example, the asynchronous FIFOs 112 may be configured to interface the physical read datapaths 114 with the memory controller 102.

In general, the signals DQ and DQS may be presented to the DDR PHY 104 on a number of buses. The signals DQ and DQS may be broken out to multiple instantiations of DP hardmacros. The DPs may be configured via internal settings to delay the read data strobe signals DQS based on one or more control signals (or values) from the MDELAY circuit 116. Each of the DPs 114 may be configured to present the DQ data to a respective asynchronous FIFO 112 via the signals DR_PDQ_OUT and DR_NDQ_OUT, after the data is sampled using the delayed read data strobe signals DQS.

The FIFOs 112 are generally configured to transfer the read data DQ from the read data strobe (or DQS) domain to the CLK_1X domain for presentation to the memory controller 102. The read data DR_PDQ_OUT and DR_NDQ_OUT are generally written to the FIFOs 112 in response to (e.g., clocked by) the signals PDQS_OUT and NDQS_OUT, respectively). The memory controller 102 may be configured to read the data DQ (e.g., via signals PI_R_PDQ and PI_R_NDQ) from the FIFOs 112 in response to the clock signal CLK_1X. In one example, the FIFOs 112 may be implemented as eight words deep.

As briefly described above, the read datapaths 114 are generally programmable from when the data/strobe pairs DQ/DQS are received at the input to the circuit 104, to sampling the read data with the read data strobe signal DQS, and passing the data to the memory controller 102. The programmability of the read datapaths 114 generally provides flexibility for handling different column address strobe (CAS) latencies, burst lengths, device process variation, and/or propagation delays.

The master delay (MDELAY) logic 116 is generally configured to calculate a delay value for generating a one-quarter cycle or one-fifth cycle delay with respect to the device reference clock (e.g., the signal CLK_1X). The calculated delay is generally used by the datapaths 114 to center a read data capture clock (e.g., the signal DQS) in a valid DDR device read data window. The calculated delay generally tracks process, voltage and temperature (PVT) corners for reliable read data latching. The MDELAY logic 116 may be configured to generate the one-quarter cycle or one-fifth cycle delay using a delay lock loop (DLL). Once the DLL is locked to the clock signal CLK_1X, a signal (e.g., MDELAY_LOCK) may be generated indicating the locked state. The signal MDELAY_LOCK may be presented to an input of the control logic 117 and/or the memory controller 102.

The MDELAY logic 116 may be configured to generate one or more control signals (or values) for transferring the delay settings (or values) to one or more slave delay cells (describe in more detail in connection with FIGS. 3A and 3B) in each of the DPs 114. The delay values, when transferred to each of the DPs 114, are generally referred to as base delays. In one example, a base delay may be implemented for each nibble of each DP byte. For example, a first base delay value (e.g., BASE_DELAY_UN) may be implemented for each upper nibble and a second base delay value (e.g., BASE_DELAY_LN) may be implemented for each lower nibble. The DPs 114 may also be programmed with offset delay values corresponding to each nibble (e.g., OFFSET_P_UN, OFFSET_N_UN, OFFSET_P_LN and OFFSET_N_LN). In one example, each of the DPs 114 may have a set of base delays that are independent of the other DPs 114. The offset delay values may be added to or subtracted from the respective base delay values.

The control circuit 117 may be configured to generate one or more control signals for controlling and/or configuring the FIFOs 112 and datapaths 114. In one example, the control circuit 117 may be configured to generate a gating signal (e.g., RD_GATE) in response to a signal (e.g., MC_CMD) received from the controller 102. In one example, the circuit 117 may be configured to generate the signal RD_GATE in response to decoding a READ command in the signal MC_CMD. The signal RD_GATE is generally configured to prevent invalid states (e.g., when DQS is in a 3-state, or OFF, mode) from entering the circuit 113. The signal RD_GATE may be used to generate one or more gating signals.

The programmable gateon generating circuit 118 may be configured to generate the signal GATEON in response to the signal RD_GATE, a first clock signal (e.g., CLK_1X), a second clock signal (e.g., CLK_13 2X) and a data strobe signal (e.g., DQS_INTN) received from the DPs 114. The signal GATEON may be used to gate the read data strobe signal DQS received from the memory device 106. In one example, separate gating signals (e.g., GATEON_UN, GATEON_LN, etc.) may be generated for each nibble of the DPs 114. The signal DQS_INTN may be used to de-assert the signal GATEON. In one example, separate signals (e.g., DQS_INTN_UN and DQS_INTN_LN) may be generated for each nibble of the DPs 114. Although the circuit 118 is shown implemented separately from the DPs 114, it will be understood by those skilled in the art that the circuit 118 may be implemented as part of the DPs 114 (e.g., the signal GATEON may be generated within the DPs 114 or external to the DPs 114).

Figure 3A:
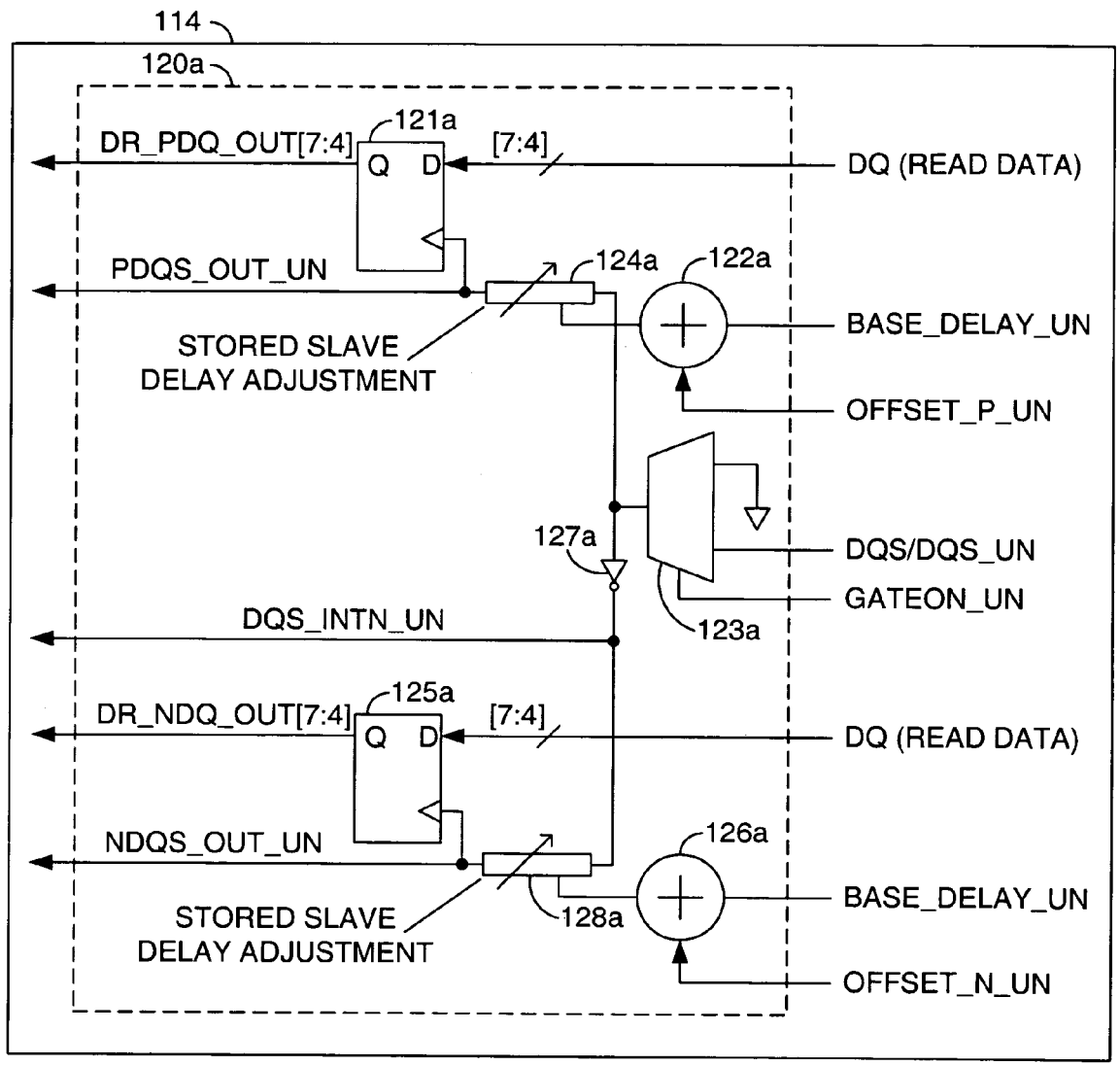
FIG. 3(A-B) are more detailed block diagrams illustrating details of read data latching and gating.
Figure 3B:
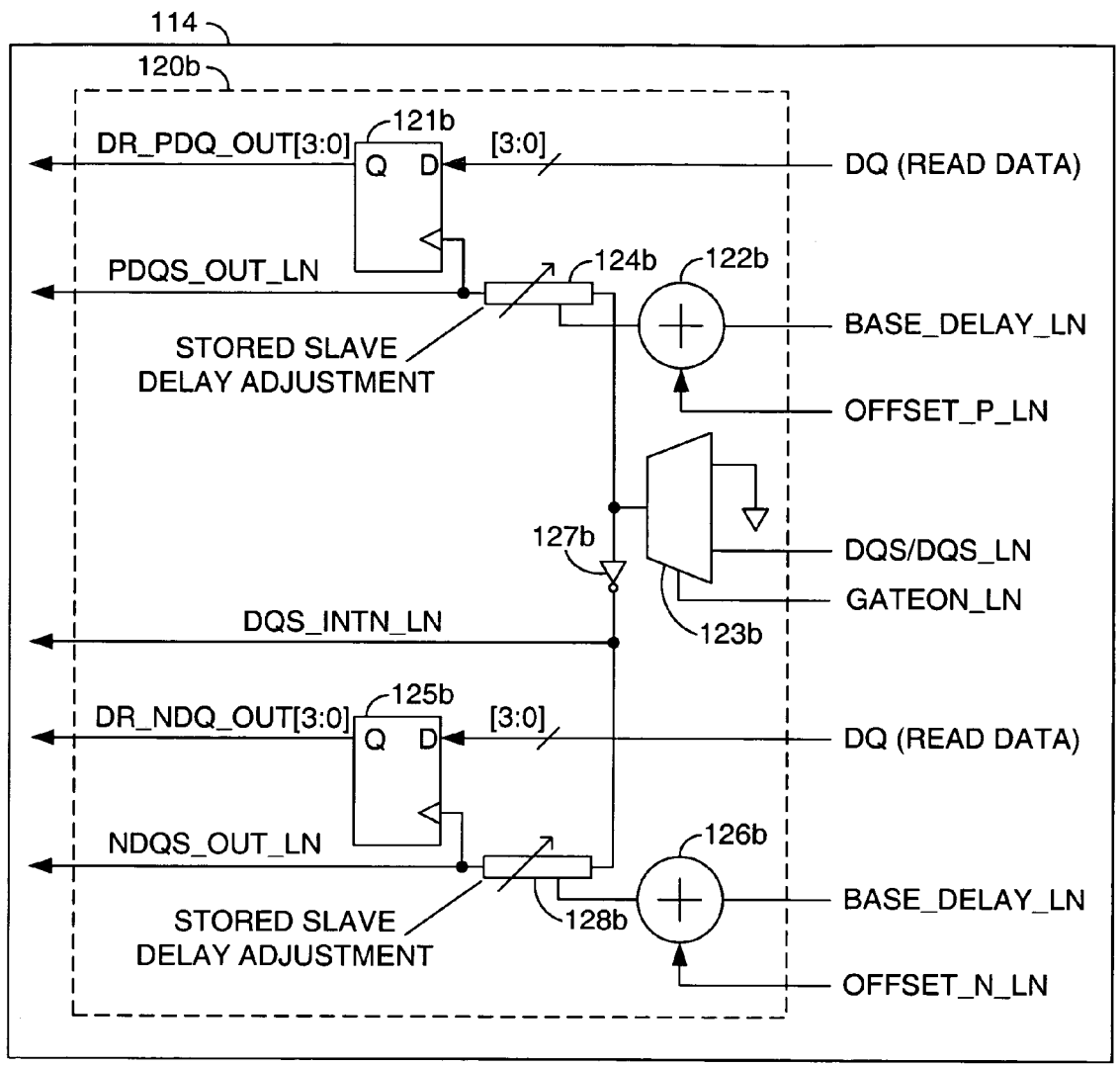

Referring to FIGS. 3(A-B), more detailed block diagrams of a datapath 114 of FIG. 2 are shown illustrating an example read data latching and gating circuit in accordance with a preferred embodiment of the present invention. In one example, each datapath 114 may comprise an upper nibble pathway 120a (FIG. 3A) and a lower nibble pathway 120b (FIG. 3B). The upper nibble pathway 120a may have a first input that may receive a number of bits of the signal DQ (e.g., bits 7:4), a second input that may receive the signal BASE_DELAY_UN, a third input that may receive the signal OFFSET_P_UN, a fourth input that may receive the signal OFFSET_N_UN, a fifth input that may receive the signal DQS (or the signal DQS_UN in the x4 mode), a sixth input that may receive a signal (e.g., GATEON_UN). The upper nibble pathway 120a may also have a first output that may present a number of bits (e.g., the signal DR_PDQ_OUT[7:4]), a second output that may present a number of bits (e.g., the signal DR_NDQ_OUT[7:4]), a third output that may present a signal (e.g., PDQS_OUT_UN), a fourth output that may present a signal (e.g., NDQS_OUT_UN) and a fifth output that may present a signal (e.g., DQS_INTN_UN).

The upper nibble pathway 120a may comprise a circuit (or block) 121a, a circuit (or block) 122a, a circuit (or block) 123a, a circuit (or block) 124a, a circuit (or block) 125a, a circuit (or block) 126a, a circuit (or block) 127a and a circuit (or block) 128a. The circuit 121a may be implemented as one or more registers. The circuit 122a may be implemented as an adder block. The circuit 123a may be implemented as a multiplexer circuit. The circuit 124a may be implemented as a slave delay adjustment block. The circuit 125a may be implemented as one or more registers. The circuit 126a may be implemented as an adder block. The circuit 127a may be implemented as an inverter circuit. The circuit 128a may be implemented as a slave delay adjustment block.

The circuit 121a may be configured to latch an upper nibble (e.g., bits 7:4) of the read data signal DQ in response to a clock input. The circuit 121a may be further configured to present the latched read data as the signal DR_PDQ_OUT[7:4]. The circuit 122a may be configured to generate a sum (or difference) of the signals BASE_DELAY_UN and OFFSET_P_UN. The circuit 123a may be configured to select either the signal DQS (or the signal DQS_UN in the x4 mode) or a predetermined logic level (e.g., a LOW or logic 0) in response to the signal GATEON_UN. The circuit 124a may be configured to delay the signal presented by the circuit 123a based on the sum (or difference) generated by the circuit 122a. An output of the circuit 124a may present the signal PDQS_OUT_UN to the clock input of the circuit 121a and the third output of the upper nibble pathway 120a.

The circuit 125a may be configured to latch an upper nibble (e.g., bits 7:4) of the read data signal DQ in response to a clock input. The circuit 125a may be further configured to present the latched read data as the signal DR_NDQ_OUT[7:4]. The circuit 126a may be configured to generate a sum (or difference) of the signals BASE_DELAY_UN and OFFSET__UN. The circuit 127a may be configured to generate the signal DQS_INTN_UN as a digital complement of the signal presented by the circuit 123a. The signal DQS_INTN_UN may be presented to an input of the circuit 128a and the fifth output of the upper nibble pathway 120a. The circuit 128a may be configured to generate the signal NDQS_OUT_UN by delaying the signal DQS_INTN_UN based on the sum (or difference) generated by the circuit 126a. An output of the circuit 128a may present the signal NDQS_OUT_UN to the clock input of the circuit 125a and the fourth output of the upper nibble pathway 120a.

The lower nibble pathway 120b may have a first input that may receive a number of bits (e.g., bits 3:0) of the signal DQ, a second input that may receive the signal BASE_DELAY_LN, a third input that may receive the signal OFFSET_P_LN, a fourth input that may receive the signal OFFSET_N_LN, a fifth input that may receive the signal DQS (or the signal DQS_LN in the x4 mode), a sixth input that may receive a signal (e.g., GATEON_LN). The lower nibble pathway 120b may also have a first output that may present a number of bits (e.g., the signal DR_PDQ_OUT[3:0]), a second output that may present a number of bits (e.g., the signal DR_NDQ_OUT[3:0]), a third output that may present the signal PDQS_OUT_LN, a fourth output that may present the signal NDQS_OUT_LN and a fifth output that may present the signal DQS_INTN_LN.

The lower nibble pathway 120b may comprise a circuit (or block) 121b, a circuit (or block) 122b, a circuit (or block) 123b, a circuit (or block) 124b, a circuit (or block) 125b, a circuit (or block) 126b, a circuit (or block) 127b and a circuit (or block) 128b. The circuit 121b may be implemented as one or more registers. The circuit 122b may be implemented as an adder block. The circuit 123b may be implemented as a multiplexer circuit. The circuit 124b may be implemented as a slave delay adjustment block. The circuit 125b may be implemented as one or more registers. The circuit 126b may be implemented as an adder block. The circuit 127b may be implemented as an inverter circuit. The circuit 128b may be implemented as a slave delay adjustment block.

The circuit 121b may be configured to latch a lower nibble (e.g., bits 3:0) of the read data signal DQ in response to a clock input. The circuit 121b may be further configured to present the latched read data as the signal DR_PDQ_OUT[3:0]. The circuit 122b may be configured to generate a sum (or difference) of the signals BASE_DELAY_LN and OFFSET_P_LN. The circuit 123b may be configured to select either the signal DQS (or the signal DQS_LN in the x4 mode) or a predetermined logic level (e.g., a LOW or logic 0) in response to the signal GATEON_LN. The circuit 124b may be configured to delay the signal presented by the circuit 123b based on the sum (or difference) generated by the circuit 122b. An output of the circuit 124b may present the signal PDQS_OUT_LN to the clock input of the circuit 121b and the third output of the lower nibble pathway 120b.

The circuit 125b may be configured to latch a lower nibble (e.g., bits 3:0) of the read data signal DQ in response to a clock input. The circuit 125b may be further configured to present the latched read data as the signal DR_NDQ_OUT[3:0]. The circuit 126b may be configured to generate a sum (or difference) of the signals BASE_DELAY_LN and OFFSET_N_LN. The circuit 127b may be configured to generate the signal DQS_INTN_LN as a digital complement of the signal presented by the circuit 123b. The signal DQS_INTN_LN may be presented to an input of the circuit 128b and the fifth output of the lower nibble pathway 120b. The circuit 128b may be configured to generate the signal NDQS_OUT_LN by delaying the signal DQS_INTN_LN based on the sum (or difference) generated by the circuit 126b. An output of the circuit 128b may present the signal NDQS_OUT_LN to the clock input of the circuit 125b and the fourth output of the lower nibble pathway 120b.

Figure 4:
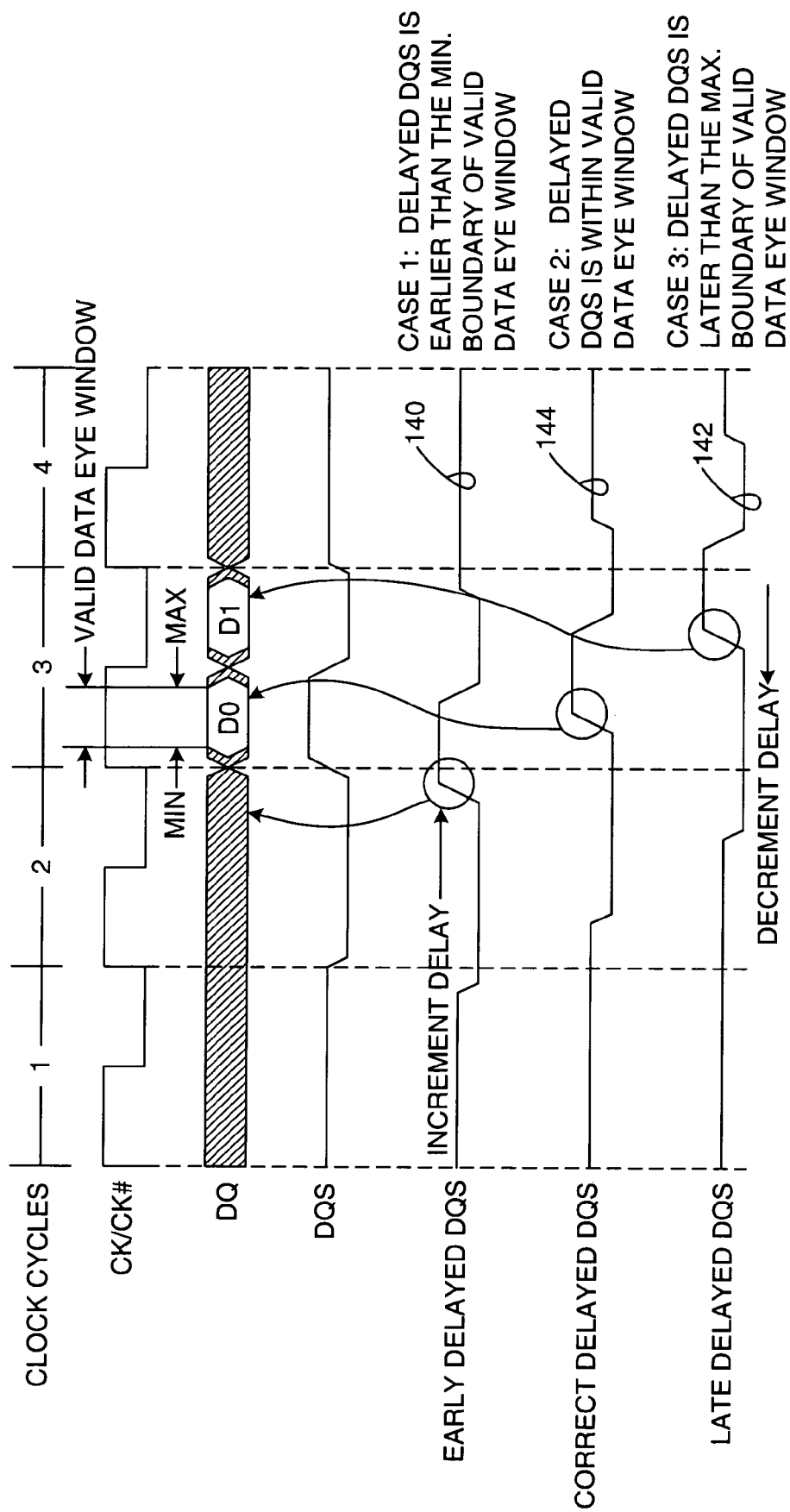
FIG. 4 is a timing diagram illustrating various data and strobe signals of a DDR SDRAM interface.

Referring to FIG. 4, a timing diagram is shown illustrating various signals implemented in the interface between the physical interface 104 and the DDR SDRAM device 106. The circuit 104 generally receives aligned DQ and DQS signals from the DDR SDRAM device(s) 106. As used herein, the term data eye is generally used to refer to a characteristic appearance of the read data signal waveforms, on the DQ lines. The term read training generally refers to a process performed, for example, at powerup or reset, to establish optimum DQS strobe settings. The circuits 124a, 124b, 128a and 128b within the datapath (DP) hardmacro are generally configured to shift the DQS strobe to be optimally positioned relative to DQ (valid read data). In one example, the circuits 124a, 124b, 128a and 128b may be configured to shift the DQS strobe by one-quarter or one-fifth cycle.

The present invention generally provides robust sampling of the read data over process, voltage, and temperature (PVT) variations. The present invention generally provides a systematic process for calibrating the center of the data valid window over process, voltage and temperature (PVT) corners. A double data rate (DDR) synchronous dynamic random access memory (SDRAM) device generally implements source synchronous data transfer technology where the data signal DQ and the related data strobe signal DQS are sent together by the transmitting device. Due to signal integrity and system implementation factors, a receive data valid window may be reduced to a certain extent (e.g., the shaded portions in the D0 and D1 regions of the signal DQ in FIG. 4). A receiving device implementing the present invention may realize an optimal timing for the read data strobe signal DQS.

The present invention generally provides for adjusting a delay of the read data strobe signal DQS to approximately center the read data strobe signal DQS in the valid data eye window. For example, when the delay is too short, the read data strobe signal DQS is generally earlier than a minimum boundary of the valid data eye window (e.g., trace 140). When the delay is too great, the read data strobe signal DQS is generally later than a maximum boundary of the valid data eye window (e.g., trace 142). In general, a correctly set delay places the read data strobe signal DQS within the valid data eye window (e.g., trace 144).

The present invention may be implemented in logic (e.g., hard intellectual property (IP), firm IP and/or soft IP) that may provide read data synchronization from the DQS domain on an external DDR SDRAM memory bus to a 1x clock domain (e.g., the signal CLK_1X) used by the DDR PHY 104 and the DDR memory controller 102. The read data strobe signal DQS may be used to clock in the read data. The present invention generally enables a reliable data read operation for high speed applications.

Figure 5:
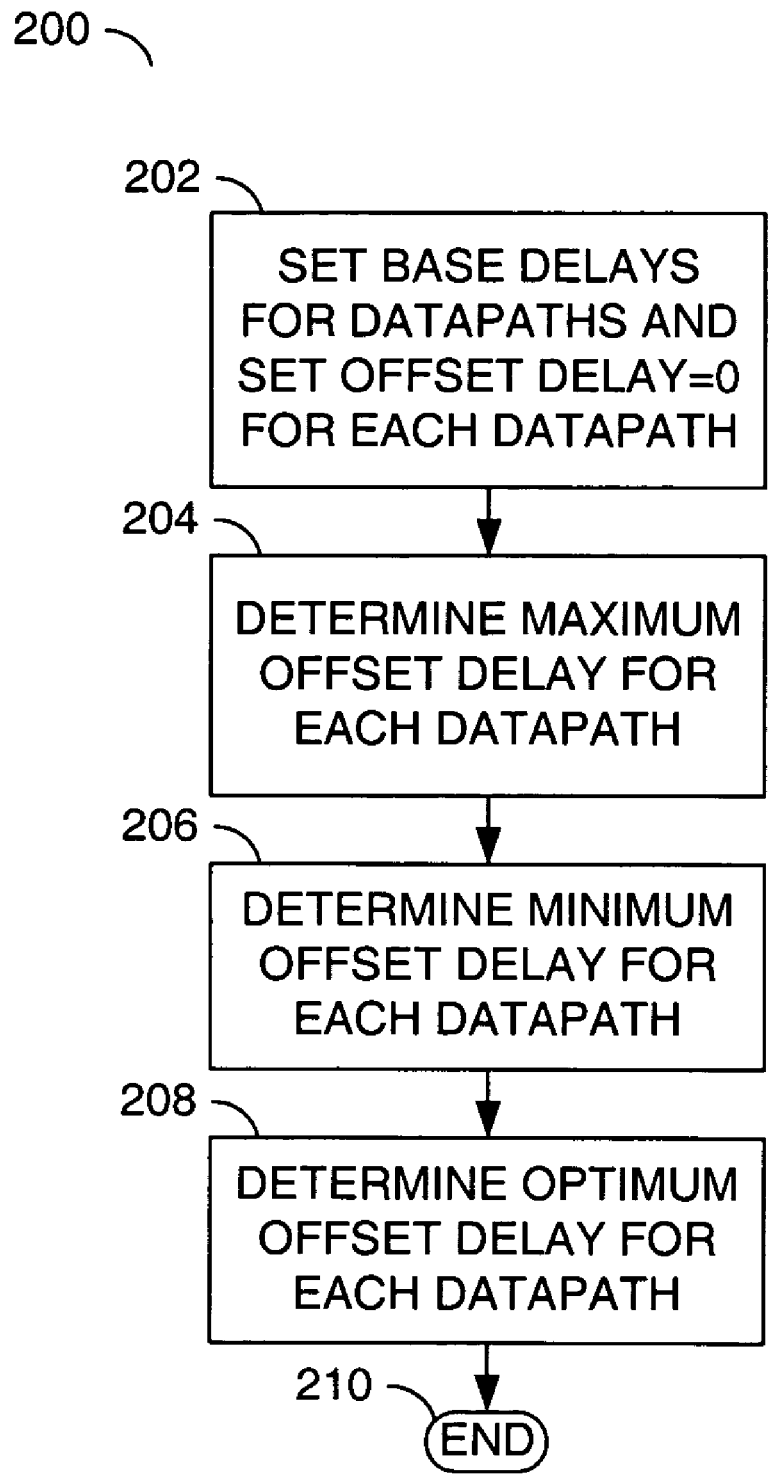
FIG. 5 is a flow diagram illustrating a training process in accordance with a preferred embodiment of the present invention.

Referring to FIG. 5, a flow diagram is shown illustrating a process 200 in accordance with a preferred embodiment of the present invention. In one example, the process 200 may begin by setting base delays (e.g., BASE_DELAY_LN and BASE_DELAY_UN) in each of the datapaths 114 to a predetermined initial value and setting offset delays (e.g., OFFSET_P_LN, OFFSET_N_LN, OFFSET_P_UN and OFFSET_N_UN) for each of the datapaths 114 to zero (e.g., block 202). A write/read/compare test may be performed to verify that the memory device 106 may be read using the initial base delay and offset delay values.

In one example, the process of setting the initial base and offset delays may comprise the following steps:

1. Verifying that the MDELAY (Master Delay) circuit 116 has achieved DLL lock. In one example, verification may be performed by reading a first bit (e.g., L or lock) and a second bit (e.g., LF or lock failure) in a register of the MDELAY circuit 116. If the verification fails (e.g., the L bit is not one or the LF bit is not zero), the MDELAY circuit 116 may be reset to recover from the failure condition.
2. Transferring MDELAY DQS delay control values (the base delay values) to the DPs 114. In one example, the base delay values may be transferred by writing to one or more registers.
3. Setting a number of bits (e.g., base delay select bits) so the updated delay values may be loaded into the base delays of the DPs 114.
4. Setting the offset delay values in the DPs 114 to zero. In one example, the offset delay values in the DPs 114 may be set to zero by using a control register. In one example, a number of offset delays (e.g., four) may be implemented for each DP 114. The delay values may be initially set to zero after the reset.
5. Establishing pointers and storage locations for the minimum and maximum offset delay values to be determined by the process 200 and initializing the offset delay values appropriately (e.g., using signed 2's-complement format). For example, an offset delay value may be implemented for each nibble of each DP byte, and for each nibble a positive-edge strobe offset and a negative-edge strobe offset may be implemented. For example, four offset delay values per DP 114 may be implemented (e.g., OFFSET_N_LN, OFFSET_P_LN, OFFSET_N_UN and OFFSET_P_UN).
6. Verifying that valid DDR data may be read with the delay offset values set to zero. For example, a routine may be executed that writes to, reads from, and compares a selected data pattern to a selected range of the DDR memory 106.

If valid data cannot be read with the delay offset values set to zero, the initial settings may not be sufficient. In one example, delay settings for the signal GATEON may be re-evaluated. However, high level system debugging may also be performed. In one example, a signal (e.g., an error signal) may be generated to inform the user.

The process 200 generally continues by determining maximum offset delay values for each DP 114 (e.g., block 204). For example, maximum upper and lower nibble offset delay values may be determined for each DP 114 (e.g., using a positive adjustment routine). When maximum offset delay values have been determined for each of the datapaths, the process 200 generally determines minimum offset delay values for each DP 114 (e.g., the block 206). For example, minimum upper and lower nibble offset delay values may be determined for each DP 114 (e.g., using a negative adjustment routine).

When both maximum and minimum offset delay values have been determined for each offset delay value of each of the DPs 114, the process 200 generally determines optimum offset delay values for each of the DPs 114 and loads (or programs) the optimum offset delay values into the DPs 114 (e.g., the block 208). In one example, the minimum and maximum values for each offset delay may be used to determine an average offset delay value (e.g., (max offset+min offset)/2) as the optimum offset value. The optimum values may be written, in one example, to a respective register (e.g., a DP Slave Delay register) using a control register (e.g., a DDR PHY Select Slave Delay register). When the optimum offset delay values are loaded into each of the DPs 114, the process 200 generally ends (e.g., block 210).

In one embodiment, the present invention may be implemented as computer executable code configured to effectively determine the center of the valid data window, such that the desired DQ-DQS timing relationship can be met. In general, the signal GATEON is made active only during read operations. The signal GATEON is inactive at all other times, if a programmable GATEON is implemented. A read GATEON training process, described in a application Ser. No. 11,173,529, filed Jul. 1, 2005, now U.S. Pat. No. 7,215,584, issued May 8, 2007, which is hereby incorporated by reference in its entirety, may be executed before the DQ-DQS timing adjustment of the present invention is made (except at power-up or reset, when a default slave delay may be loaded before read GATEON training proceeds).

Figure 6:
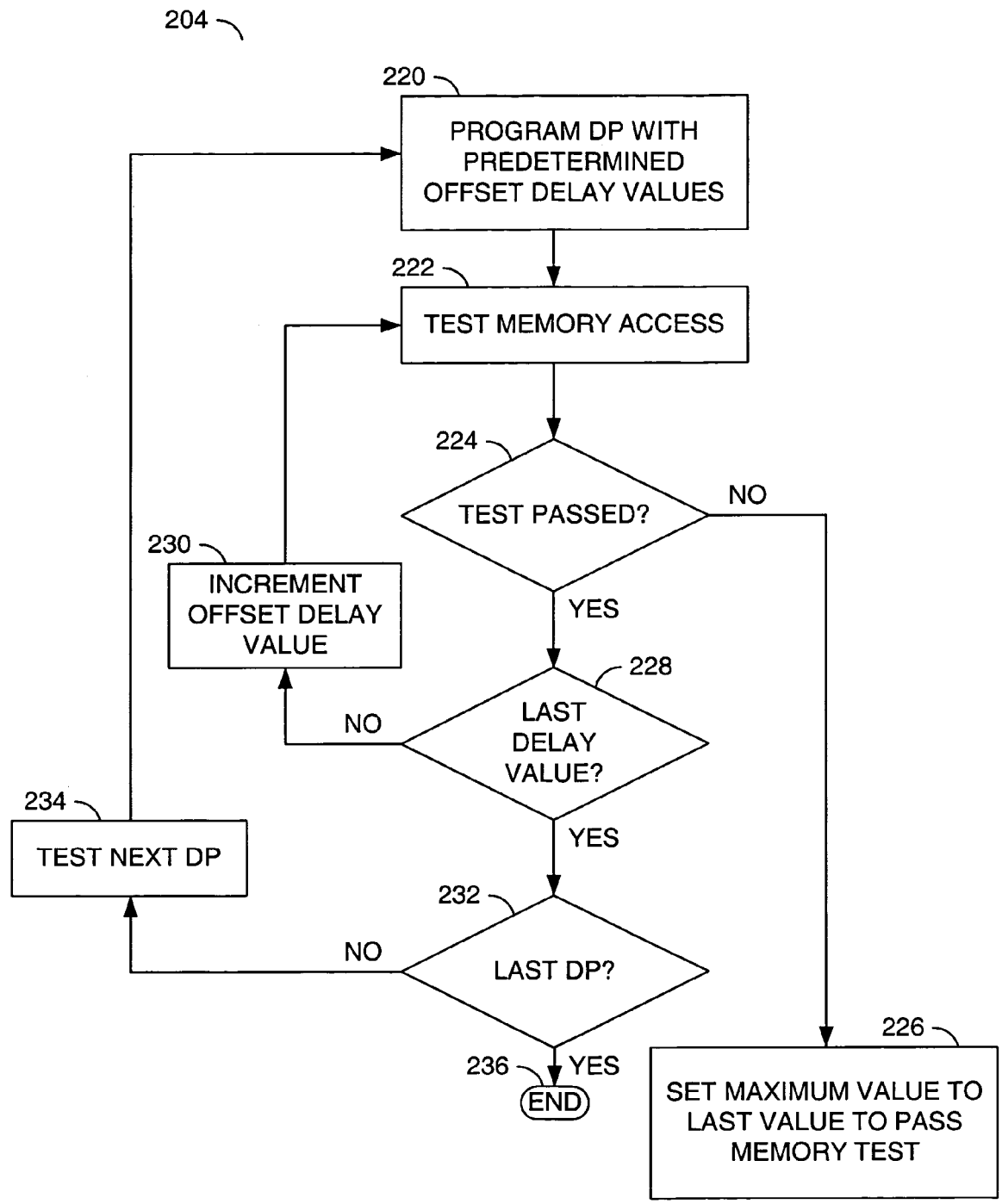
FIG. 6 is a more detailed flow diagram illustrating a process for determining a maximum offset delay value.

Referring to FIG. 6, a more detailed flow diagram of the block 204 in FIG. 5 is shown illustrating a process for determining the maximum offset values. In one example, the process for determining the maximum offset values may comprise the following steps:

1. Using a PAR (Positive Adjustment Routine), increment each offset delay value.
2. Programming the DP 114 with the selected new offset values.
3. Testing the read data at each increment.
4. Repeating step 1 through step 3, until the read test fails.
5. Recording the highest delay setting that yields valid data.

The highest delay setting that yields valid data is the maximum offset for the respective delay.

In one example, the process 204 may be implemented with a number of steps 220-236. The process 204 may begin by programming the datapaths with predetermined offset values (e.g., block 220). The process 204 may perform a test access on the memory 106 (e.g., blocks 222 and 224). When the memory test access fails, the process 204 may set the maximum offset delay value for the corresponding datapath 114 to the last value that passed the test (e.g., block 226). When the memory test access passes, the process 204 generally checks whether all delay values have been tested (e.g., block 228). When all the delay values have not been tested, the process 204 generally proceeds by incrementing the (e.g., block 230) and repeating the memory access test. When the last delay value for a particular datapath 114 has been tested, the process 204 generally determines whether all of the datapaths 114 have been tested (e.g., block 232). When all the datapaths 114 have not been tested, the process 204 moves to a next datapath 114 (e.g., block 234). When all datapaths 114 are tested, the process 204 generally ends (e.g., block 236).

Figure 7:
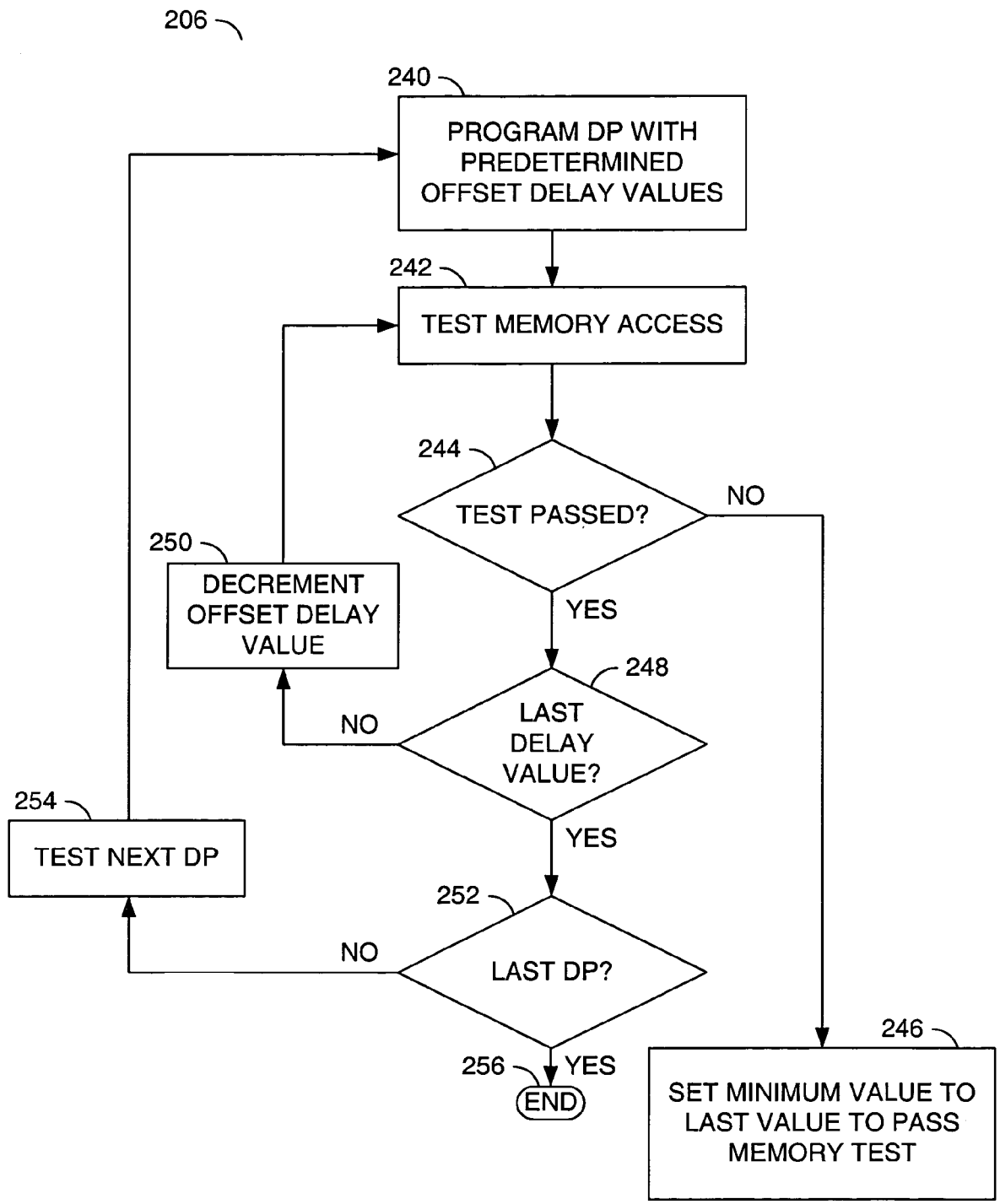
FIG. 7 is a more detailed flow diagram of a process for determining a minimum offset delay value.

Referring to FIG. 7, a more detailed flow diagram of the block 206 of FIG. 5 is shown illustrating a process for determining the minimum offset values. In one example, the process for determining the minimum offset values may comprise the following steps:

1. Using a NAR (Negative Adjustment Routine), decrement each offset delay value.
2. Programming the DP 114 with the selected new offset values.
3. Testing the read data at each decrement.
4. Repeating step 1 through step 3, until the read test fails.
5. Recording the lowest (e.g., most-negative in signed-2's complement format) delay value that yields valid data.

The lowest delay value that yields valid data is the minimum offset for the respective delay.

In one example, the process 206 may be implemented with a number of steps 240-256. The process 206 may begin by programming the datapaths 114 with predetermined offset values (e.g., block 240). The process 206 may perform a test access on the memory 106 (e.g., blocks 242 and 244). When the memory test access fails, the process 206 may set the minimum offset delay value for the corresponding datapath 114 to the last value that passed the test (e.g., block 246). When the memory test access passes, the process 206 generally checks whether all delay values have been tested (e.g., block 248). When all the delay values have not been tested, the process 206 generally proceeds by decrementing the delay value (e.g., block 250) and repeating the memory access test. When the last delay value for a particular datapath 114 has been tested, the process 206 generally determines whether all of the datapaths 114 have been tested (e.g., block 252). When all the datapaths 114 have not been tested, the process 206 moves to a next datapath 114 (e.g., block 254). When all datapaths 114 are tested, the process 206 generally ends (e.g., block 256).

The functions performed by the flow diagrams of FIG. 5-7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of application specific integrated circuits (ASICs), application specific standard products (ASSPs), field programmable gate arrays (FPGAs), or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMS, RAMs, EPROMS, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for calibrating a data valid window comprising the steps of:
   determining an optimum offset delay value for each of one or more datapaths based upon actual memory accesses, wherein determining said optimum offset delay value comprises averaging a maximum offset delay value and a minimum offset delay value of each of said one or more datapaths; and
   delaying a read data strobe signal based upon a base delay and said optimum offset delay value for each of said one or more datapaths.

2. The method according to claim 1, wherein the step of determining said optimum offset delay value comprises the steps of:
   determining said maximum offset delay value for each of said one or more datapaths based upon actual memory accesses; and
   determining said minimum offset delay value for each of said one or more datapaths based upon actual memory accesses.

3. The method according to claim 2, further comprising the steps of:
   determining a maximum offset delay value for each nibble of said one or more datapaths based upon actual memory accesses; and
   determining a minimum offset delay value for each nibble of said one or more datapaths based upon actual memory accesses.

4. The method according to claim 3, wherein the step of determining said optimum offset delay value for each of said one or more datapaths further comprises:
   averaging a maximum offset delay value and a minimum offset delay value of each nibble of each of said one or more datapaths.

5. The method according to claim 2, wherein the step of determining said maximum offset delay value comprises the steps of:
   setting an offset delay value of each of said datapaths to a predetermined value;
   testing a memory access using said offset delay value;
   incrementing said offset delay value by a predetermined amount; and
   repeating the steps of testing and incrementing until said memory access test fails.

6. The method according to claim 2, wherein the step of determining said minimum offset delay value comprises the steps of:
   setting an offset delay value of each of said datapaths to a predetermined value;

testing a memory access using said offset delay value;
decrementing said offset delay value by a predetermined amount; and
repeating the steps of testing and decrementing until the memory access test fails.

7. The method according to claim 1, wherein said actual memory accesses comprise the steps of:
writing data to a memory device;
reading data from said memory device;
comparing the data read from said memory device to the data written to said memory device; and
determining a pass/fail status based on a result of the comparing step.

8. The method according to claim 7, wherein said data comprises a predetermined pattern.

9. A computer readable medium having instructions for causing a computer to execute the method according to claim 1.

10. An apparatus comprising:
a first circuit configured to determine an optimum offset delay value for each of one or more datapaths based upon actual memory accesses, wherein said first circuit is further configured to average a maximum offset delay value and a minimum offset delay value for each of said one or more datapaths; and
a second circuit configured to delay a data strobe signal based on a base delay and said optimum offset delay for each of said one or more datapaths.

11. The apparatus according to claim 10, wherein said first circuit is further configured to:
determine said maximum offset delay value for each of said one or more datapaths based upon actual memory accesses; and
determine said minimum offset delay value for each of said one or more datapaths based upon actual memory accesses.

12. The apparatus according to claim 11, wherein said first circuit is further configured to:
determine a maximum offset delay value for each nibble of said one or more datapaths based upon actual memory accesses; and
determine a minimum offset delay value for each nibble of said one or more datapaths based upon actual memory accesses.

13. The apparatus according to claim 12, wherein said first circuit is further configured to:
average a maximum offset delay value and a minimum offset delay value of each nibble of each of said one or more datapaths.

14. The apparatus according to claim 11, wherein said first circuit is further configured to:
set an offset delay value of each of said datapaths to a predetermined value;
test a memory access using said offset delay value;
increment said offset delay value by a predetermined amount; and
repeatedly test and increment said offset delay value until said memory access fails.

15. The apparatus according to claim 11, wherein said first circuit is further configured to:
set an offset delay value of each of said datapaths to a predetermined value;
test a memory access using said offset delay value;
decrement said offset delay value by a predetermined amount; and
repeatedly test and decrement said offset delay value until said memory access fails.

16. The apparatus according to claim 10, wherein said first circuit is further configured to:
write data to a memory device;
read data from said memory device;
compare the data read from said memory device to the data written to said memory device; and
determine a pass/fail status based on a result of the comparison.

17. The apparatus according to claim 10, wherein said first and said second circuits are instantiated on a structured application specific integrated circuit (ASIC).

18. A memory interface circuit comprising:
means for determining an optimum offset delay value for each of one or more datapaths using actual memory accesses, wherein determining said optimum offset delay value comprises averaging a maximum offset delay value and a minimum offset delay value for each of said one or more datapaths; and
means for delaying a read data strobe signal based on a base delay and said optimum offset delay for each of said one or more datapaths.

19. The method according to claim 1, further comprising setting said base delay of said one or more datapaths to a predetermined value.

20. The apparatus according to claim 10, further comprising a third circuit configured to set said base delay of said one or more datapaths to a predetermined value.

* * * * *